US005594238A

United States Patent [19]

Endruschat et al.

[11] Patent Number: 5,594,238
[45] Date of Patent: Jan. 14, 1997

[54] TOUCHLESS SWITCH WHICH DISCRIMINATES BETWEEN MOTION INTENDED TO TOGGLE THE SWITCH AND OTHER FORMS OF MOTION

[75] Inventors: Albert J. Endruschat, 392 Glenbrook Dr., Atlantis, Fla. 33462; Charles W. Staples; Arthur K. Casaday, both of Boca Raton, Fla.

[73] Assignee: Albert J. Endruschat, Atlantis, Fla.

[21] Appl. No.: 390,683

[22] Filed: Feb. 17, 1995

[51] Int. Cl.$^6$ .................. G01V 9/04; E03C 1/05
[52] U.S. Cl. ............... 250/221; 250/214 B; 250/214 C; 250/214 SW; 4/304
[58] Field of Search .................. 250/214 B, 214 C, 250/214 AL, 214 SW, 221, 239, 338.1; 4/304, 623; 340/555, 556

[56] References Cited

U.S. PATENT DOCUMENTS

| | | | |
|---|---|---|---|
| 3,621,268 | 11/1971 | Friedrich | 250/221 |
| 3,702,928 | 11/1972 | Alger | 240/1.4 |
| 3,842,257 | 11/1974 | Kohler | 250/206 |
| 4,008,415 | 2/1977 | De Avilla-Serafin et al. | 315/156 |
| 4,051,365 | 9/1977 | Fukuyama et al. | 250/222 R |
| 4,084,088 | 4/1978 | Moose | 250/209 |
| 4,207,466 | 6/1980 | Drage et al. | 250/338 |
| 4,243,879 | 1/1981 | Carroll et al. | 250/221 |
| 4,282,430 | 8/1981 | Hatten et al. | 250/221 |
| 4,354,106 | 10/1982 | Walter | 250/239 |
| 4,409,473 | 10/1983 | Furuta et al. | 250/206 |
| 4,415,952 | 11/1983 | Hattori et al. | 362/32 |
| 4,564,756 | 1/1986 | Johnson | 250/231 SE |
| 4,659,922 | 4/1987 | Duncan | 250/221 |
| 4,735,357 | 4/1988 | Gregory et al. | 236/93 R |
| 4,736,097 | 4/1988 | Philipp | 250/221 |
| 4,843,283 | 6/1989 | Chen | 315/153 |
| 4,878,107 | 10/1989 | Hopper | 357/72 |
| 4,960,248 | 10/1990 | Bauer | 242/564.4 |
| 4,972,070 | 11/1990 | Laverty, Jr. | 250/221 |
| 5,008,529 | 4/1991 | Nakamura | 250/221 |
| 5,018,057 | 5/1991 | Biggs et al. | 362/295 |
| 5,025,516 | 6/1991 | Wilson | 4/623 |
| 5,059,877 | 10/1991 | Teder | 318/444 |
| 5,060,323 | 10/1991 | Shaw | 4/623 |
| 5,103,085 | 4/1992 | Zimmerman | 250/221 |
| 5,126,555 | 6/1992 | Hawryluk | 250/221 |
| 5,136,156 | 8/1992 | Nounen et al. | 250/221 |
| 5,208,516 | 5/1993 | Saidian | 315/362 |

*Primary Examiner*—Stephone Allen
*Attorney, Agent, or Firm*—John C. Smith

[57] ABSTRACT

A touchless switch using a single detector to measure ambient energy and reflected energy. The detector can detect objects in both the normal unsaturated ambient energy state or when ambient energy is saturating the detector. Discrimination between toggle motion and motion which is not intended to indicate a switch toggle operation is also provided. The detector and the emitter are mounted to a circuit board which is then mounted within a housing which has a window that allows passage of ambient energy and reflected energy. A barrier between the detector and the emitter blocks energy from being directly transmitted from the emitter to the detector. The barrier may be inserted into a groove in the window to prevent energy from the emitter from being reflected off of the inner surface of the window to the detector. Accidental triggering by ambient energy is prevented by requiring that the reflected energy be detected for a minimum amount of time. Accidental triggering by objects not intended to toggle the switch is avoided by requiring that toggling be initiated by a moving object which reflects energy within a preselected time window. Alternate embodiments are shown which replaces standard wall switches and provides automatic illumination of locks at night.

15 Claims, 11 Drawing Sheets

TOUCHLESS SWITCH WHICH DISCRIMINATES BETWEEN MOTION INTENDED TO TOGGLE THE SWITCH AND OTHER FORMS OF MOTION

BACKGROUND OF THE INVENTION

1. Technical Field

The present invention relates to touchless toggle switches. In particular, it relates to sensor systems capable of measuring background and foreground light with a single sensor, detecting the presence of an object even when the background energy creates a saturation condition in the detector, and discriminating between motion intended to toggle a switch and other forms of motion.

2. Background Art

A variety of applications can benefit from the replacement of mechanical switches or control mechanisms with non-mechanical switches. For example, public facilities used by individuals not responsible for the equipment they use are susceptible to misuse and damage which can often be avoided through the replacement of mechanical switching devices with non-mechanical devices less prone to damage or misuse. Likewise, individuals in occupations which require high levels of cleanliness, such as health care or laboratory personnel, also benefit from the ability to activate devices without coming into physical contact with them.

Several known techniques have been used in the past to provide switch activation which is accomplished without moving a mechanical switch lever or touching. In situations where mechanical activation of switches is inappropriate or difficult, such as in billboards or street lights, automatic systems are known which use photocells to measure ambient light to determine when the lamps in the billboards or street lights are to be activated. These devices use ambient light only and do not provide any method of selectively activating the lights.

Another technique has been the use of a light emitter which projects light through an aperture in a housing assembly. Included in the same housing assembly are a plurality of photocells which are activated when a fingertip covers the aperture. Of course, this technique typically requires that the user actually touch the housing assembly to activate the switch. Further, there is no provision for measuring ambient light.

Other switching devices have been based on the use of a continuously activated emitter/photocell combination which is activated when the beam is broken or reflected back. This type of device is typically used in alarm systems; automatic controls such as those used for water valve controls, sometimes used in conjunction with timing delay or actuation methods or circuits.

A common drawback to many of the aforementioned systems is that the measurement of background or ambient light required dedicated components and the measurement of reflected or continuous direct light required a separate set of components. Due to the requirement for a large number of components, placement of switches in small areas is difficult. Further, prior detection systems have been based on the detection of a reflected light beam or break in a continuous light beam, and not on the measurement of differences in ambient light versus reflected light.

Another significant drawback to prior art solutions is that typically only the presence of an object is detected. The disadvantage to this type of detection is that the presence of an object does not always indicate that the switch is desired to be toggled. For example, a touchless switch in a medical or dental light used to illuminate patients can be advantageous in that the attending medical personnel do not have to risk contamination when toggling the lamp on or off. However, since the lights are generally in close proximity with the physician and patient, the physician can inadvertently toggle the switch. The prior art has not provided a method of preventing accidental toggling of touchless switches in this type of application.

Another serious drawback of prior art systems is their inability to detect objects in conditions of ambient saturation. Ambient saturation is caused when background energy levels are so high that even if an object is within the normal detectable distance from the sensor, it is undetectable because no difference can be measured whether an object is or is not near the sensor.

The prior art has failed to provide a single system which can detect the presence of an object by measuring the difference between ambient light and reflected light. Further, the prior art has failed to provide an effective method of preventing accidental toggling of touchless light switches when the lights are used in close proximity to the user or in conditions of either ambient saturation or non saturation.

SUMMARY OF THE INVENTION

Problems and disadvantages of the prior art are overcome by a system that provides a touchless switch which is activated by using a single detector to detect both the difference between measured ambient light and measured reflected light. The detector can detect objects in both the normal unsaturated ambient energy state or when ambient energy is saturating the detector. One embodiment allows discrimination between toggle motion and motion which is not intended to indicate a switch toggle operation. The detector and the emitter are mounted to a circuit board which is then mounted within a housing. The housing has a window which allows ambient light and reflected light to pass through. A barrier wall placed between the detector and the emitter blocks light from being directly transmitted from the emitter to the detector. The barrier wall also is inserted into a groove in the window which prevents light from the emitter from being reflected off of the inner surface of the window to the detector. Accidental triggering by ambient light is prevented by requiring that the reflected light be detected for a minimum amount of time. Accidental triggering by objects not intended to toggle the switch is avoided by requiring that toggling be initiated by a moving object which reflects light within a preselected time window. An alternate embodiment is shown which is designed as a replacement for a standard wall switch. Another embodiment provides automatic illumination of locks at night.

DESCRIPTION OF THE PREFERRED EMBODIMENT

By way of general overview, the touchless toggle switch 100 (illustrated in FIG. 1) disclosed herein can not only detect an object for purposes of actuating a toggle switch, but can also discriminate between objects moving in a fashion consistent with the intent to toggle the switch and objects which are inadvertently in front of the switch based on the presence of the object for a predetermined time interval. Further, the system disclosed herein also provides the ability to detect the presence of an object even when background energy is high enough to create a saturation state in the detector. Measurement of ambient light during non-transmission and measurement of reflected light during transmission are monitored by the same detector. Additional features include software controllable sensitivity adjustment, a timeout function to power down after a period of inactivity, a mechanical barrier imbedded within the housing window to prevent reflected light from the emitter directly to the barrier, and surface mount technology to provide more compact overall switch size. Specific application embodiments including laboratory and medical lighting or switching equipment, wall switches, water control mechanisms, alarm systems and illuminated key locks are disclosed.

Prior to a discussion of the preferred embodiment, it should be understood that while infrared emitters and detectors happen to be used in the preferred embodiment for ease of illustration, any suitable form of radiated and detected energy can be used to accomplish the goals of the invention. For example, the visible light spectrum can be used with light emitters and photocell detectors. Likewise, any other non-visible frequency range in addition to infrared can be used so long as emitter and detector devices suitable for the particular design are available. Further, even mechanical forms of energy, such as sound, may be adapted for use by devices embodying the invention. Therefore, the following discussion of the principles and advantages provided by the infrared emitter and detector devices of the preferred embodiment should be considered to also apply to non infrared technology. Finally, any frequency spectrums usable by the invention, such as visible light, infrared, ultraviolet, etc., all fall into the category referred to herein as radiation.

Figure 1:
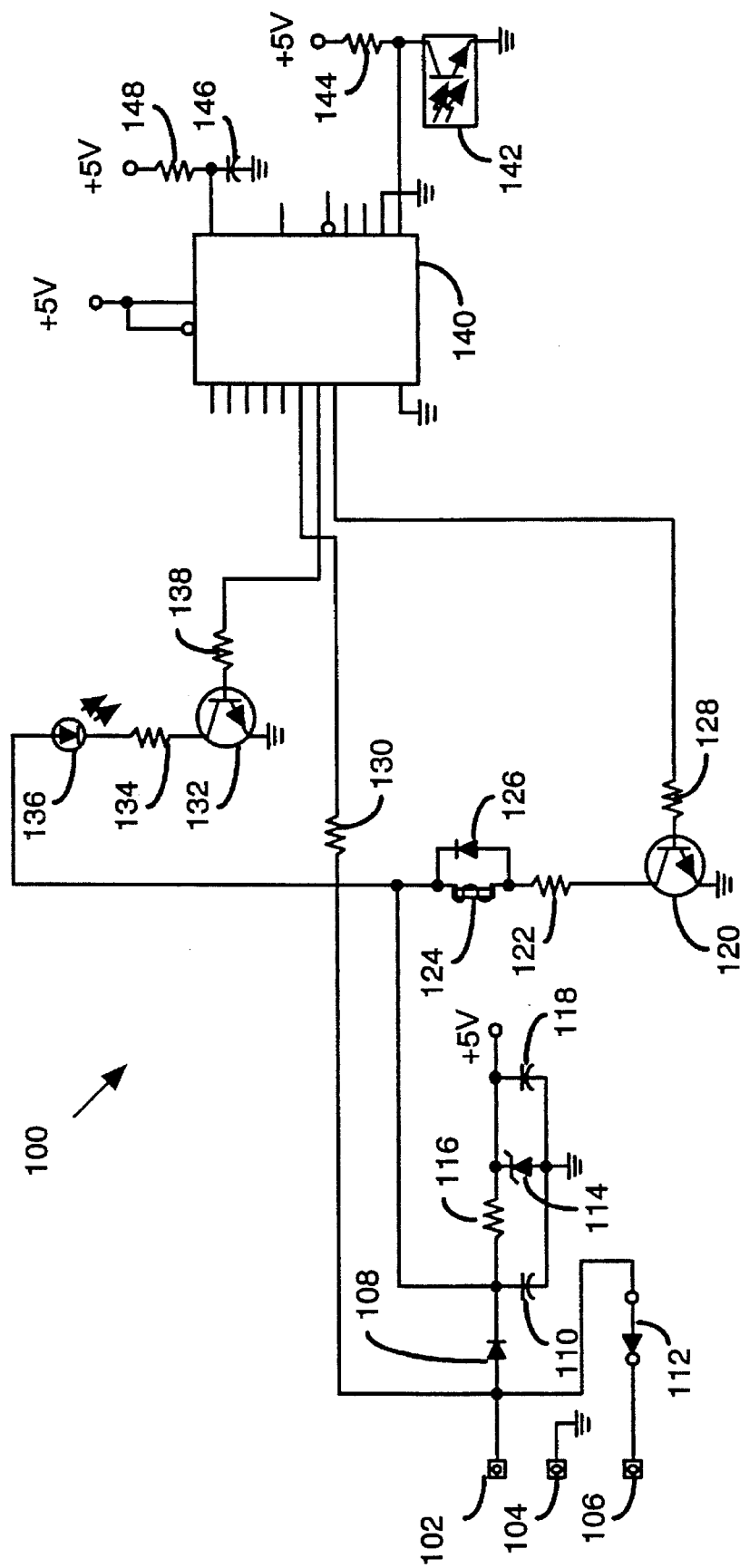
FIG. 1 is a detailed circuit diagram of a preferred embodiment of the invention.

The description of the preferred embodiment, shown in FIG. 1, refers to the control mechanism in the invention as a processor 140 for ease of discussion. However, the term processor as used herein includes devices conventionally referred to as processors, microprocessors, and microcontrollers, either in integrated circuit or discrete component form. Likewise, relay contacts 112 and relay 124 form the same physical relay in the preferred embodiment.

The improvements in detection made by the invention are accomplished by processor 140 which monitors detector 142 and controls infrared diode 136 (hereinafter referred to as emitter 136). Prior to activation of emitter 136, processor 140 monitors the output of detector 142 and determines an ambient energy level. After the ambient energy level is determined, emitter 136 is activated. If an object is in the beam of energy projected by emitter 136, some of the energy is reflected back to detector 142. Based on the difference between the ambient levels measured and the levels measured when emitter 136 is activated, processor 140 makes a determination as to whether an object is present. As indicated elsewhere in this disclosure, infrared is used in the preferred embodiment and for illustrative purposes, but the terms radiated energy, or visible light could also be used depending on the frequency range selected for the device.

The previous paragraph discussed the situation where low ambient energy levels which do not saturate detector 142 are present. The situation where high ambient energy levels exist in which the presence of an object would not be detected is discussed below in regard to FIG. 9.

In ambient saturation conditions, processor 140 measures the output of detector 142 when emitter 136 is deactivated and determines that detector 142 is in a saturated state. When this condition is detected, processor 140 does not turn on emitter 136, but waits for the next cycle instead. If an object blocks the ambient energy, processor 140 will detect that the saturated state has ended, because the measured energy level when the object is blocking the ambient energy will be lower. Processor 140 interprets this as the presence of an object and a toggle operation is initiated to toggle the switch. When the object is removed, the ambient energy will resaturate detector 142. Processor 140 interprets this resaturation as the removal of the object and then waits for the next toggle operation. A more detailed description of this operation is given in the discussion of FIG. 9.

Once the object is removed, then processor 140 returns to saturation detection mode. In situations where switch 100 is located near a window or other source of high ambient energy, the wider range of detectable signals greatly increases the usefulness of the switch. Where energy sources such as sunlight entering windows are creating an ambient saturation state, the user need only wave a hand such that it interposes between the window and switch 100 to activate a toggle operation.

As can be seen from the foregoing discussion, a principle advantage of first measuring ambient energy levels and then measuring reflected energy during activation of emitter 136 is that the device can operate over a wide range of ambient energy levels, and can even operate in situations where ambient energy levels would normally saturate detector 142.

In an alternative embodiment, switch 100 can also determine the difference between motion designed to cause a toggle operation and non toggle motion. For example, a toggle would be indicated by a hand sweeping in front of switch 100, but inadvertently stepping in front of switch 100 would not indicate a toggle operation. This is accomplished by first determining if an object has moved in front of switch 100 as was the case with the previous embodiments. However, in this embodiment a toggle operation is only indicated if the object is then removed within a preselected time window, as would be the case when a hand is waved, and not indicated when the object remains indefinitely.

To accomplish this, processor 140 first determines that an object has been detected in the normal fashion (typically five cycles in the preferred embodiment). Then it monitors the length of time the object is present. If the object does not remain in the beam field for a sufficient length of time, then the detection is discarded as invalid (i.e. noise or non-toggle motion). Likewise, if the object remains in the field for a length of time which exceeds a predetermined maximum, then it is deemed to be stationary and ignored. If the object remains in the field a preselected number of cycles, then it is deemed to indicate that switch 100 should be toggled. In the preferred embodiment, thirty consecutive cycles are used for a minimum number and one hundred twenty for a maximum number. However, this number is not critical and may vary for a particular design. The maximum number used to indicate a stationary object can also vary, but would typically allow for an object to remain for two seconds or more before stationary status is determined. This number is also not critical, but should not be so long as to create an undesirable time lag when toggling is intended.

This embodiment is useful when the user remains in close proximity with the switch. For example, when the touchless switch is used with medical or dental lamps (not shown), etc., the attending physician or dentist may inadvertently come close enough to the infrared beam to trigger a toggle operation. By discarding objects that appear to be stationary, the lamp used to illuminate the patient will not be accidentally turned off. A more detailed discussion of the circuit and mechanical housing used by the preferred embodiments follows.

FIG. 1 illustrates a circuit used in the preferred embodiment of the invention. For ease of illustration, the component numbers and pin connections will be listed separately at the end of discussion of FIG. 1. Those skilled in the art will recognize that individual component values can vary based on design considerations made to suit a particular application. Therefore, the exact component values used in the preferred embodiment are not critical.

AC power is applied to relay contacts 112 via input power lines 102, 104, 106. When relay contacts 112 is activated, power is fed to the medical or dental lamp (not shown). Input power lines 102, 104, 106 also provide power to the touchless switch 100. Rectifier diode 108 half-wave rectifies the incoming A/C which is applied to filter capacitor 110 and voltage regulator 114, 116, 118 which outputs five volts DC for use by processor 140 and associated circuitry. To avoid unnecessary power dissipation in voltage regulator 114, relay 124 and emitter 136 are powered by unregulated voltage. Those skilled in the art will recognize that voltage levels used will vary based on the technology used to implement components such as emitter 136 or relay 124.

Timing of touchless switch 100 is controlled by processor 140. In the preferred embodiment, processor 140 operates at a 1.4 MHZ rate which is controlled by resistor 148 and capacitor 146. Those skilled in the art will recognize that any suitable processor can be selected since the processor speed selected for the preferred embodiment is not critical.

AC power is input to processor 140 via resistor 130 (pin 11 on processor 140, not labeled), and is used to provide timing pulses for processor 140. A timing pulse is generated each time the AC crosses zero volts resulting in 120 timing pulses per second. The timing pulses are used to synchronize processor 140 with the AC line frequency. Further, emitter 136 is only activated during the positive portion of the AC cycle to maximize the power available to the emitter due to the normal droop in available power during the negative half cycle.

Ambient energy and reflected energy are read under control of processor 140 by resistor 144 and detector 142. Output of detector 142 is input on pin 17 (not labeled) of processor 140 which in turn coverts the data with an internal analog to digital converter (not shown).

Energy is generated under control of processor 140 by emitter 136 (in the preferred embodiment, emitter 136 is an infrared emitting diode), current limiting resistor 134, switching transistor 132, and resistor 138 by energizing output pin 12 (not labeled) of processor 140 which is connected to resistor 138.

Relay 124 which controls the load is operated by transistor 120 which is in turn controlled by processor 140 via pin 13 (not labeled) through resistor 128. Resistor 122 is a voltage dropping resistor which used when relay 124 is used with a higher than rated voltage (i.e., when a 12-volt relay is used in an 18-volt circuit). Diode 126 protects transistor 120 from back EMF which is generated when relay 124 is de-energized. Upon initial power up, processor 140 sets relay 124 to a de-energized state.

At every positive zero crossing, processor 140 waits approximately one half of the positive half cycle (approximately 4 ms) and then reads detector 142 to determine ambient light level. After the ambient level is determined, processor 140 turns on diode 136 and again measured detected light levels with detector 142. An object is judged to be present when there is a significant increase above the ambient level. The preferred embodiment uses the middle of the positive half cycle in order that AC power is available to prevent power supply droop. The diode 136 is pulsed to higher than normal levels on a fairly low duty cycle in order to obtain a greater output. This allows touchless switch 100 to be fairly insensitive to ambient light fluctuations, and therefore have a wider range of operation.

After no object is detected for a number of times and then an object is detected, it must remain detected for a number of consecutive timing pulses to toggle touchless switch 100. The preferred embodiment uses five timing pulses but this number is not critical to the invention and may vary. Once touchless switch 100 is toggled, the object must be removed for a number of consecutive timing pulses before the switch is reset such that it can be toggled again. Five is a suitable number to accomplish this reset function but can also vary.

In an alternative embodiment, processor 140 waits to toggle touchless switch 100 until it counts the total number of timing pulses before the object is removed. If the object is still present after a maximum number of timing pulses, then the object is judged to be stationary and discarded as a signal of an intent to toggle. To initiate a toggle operation in this situation, the object must first be removed for a predetermined number of timing pulses before a toggle operation can again be detected. The preferred embodiment uses a five timing pulse period to determine if a toggle is required.

Processor 140 energizes and de-energizes relay 124 such that the relay contacts 112 close or open at, or close to, the AC power zero crossing time. By so doing, contact arcing is minimized and contact life is prolonged. By using timing pulses which are synchronized with the AC line frequency, the point in time selected to energize or de-energize relay contacts 112 can be chosen based on the known mechanical switching characteristics of a particular relay.

Each time touchless switch 100 is toggled to the on state, an inactivity timer (not shown) in processor 140 is started. The inactivity timer is decremented each second. If the inactivity timer decrements to zero, the device controlled by touchless switch 100 is turned off due to inactivity.

Optionally, the device (if a lamp) can be blinked to warn the user that it will be turned off shortly by briefly having processor 140 perform two consecutive toggle operations.

Those skilled in the art will recognize that the foregoing processes can be implemented in hardware, software, firmware devices such as EPROMS, or combinations thereof. In the preferred embodiment, a combination of hardware and firmware is used.

In the area of health care, lighting is only one of several potential applications useful for touchless switch 100. Another, perhaps more valuable application, is the control of water valve assemblies. Prior art devices, such as those typically found at airports, have used infrared detectors to control faucets by turning on water flow when a user is present and turning off the water flow as soon as the user leaves. However, in health care care applications, the attending personnel are often close to the water faucet (for example, the faucet next to a dentist's chair), but do not want the water flow to automatically turn on and remain continuously on as would be the case if the prior art infrared valve assemblies were used. The switching mechanism disclosed herein allows the attending medical personnel to activate water valves without the potential of contamination. Due to the tendency of some water to either leak or be splashed around or near the faucet controls, and the fact that water is an excellent medium for transmission of bacterial contamination, etc., the ability to avoid actual contact through the use of the touchless switch 100 disclosed herein provides the patient with an additional level of protection by permitting the health care provider to activate a number of faucets or other irrigation devices without risking contact with potentially contaminated water near a faucet control.

While a principal advantage of the invention is its application to sterile environments, health care is only one application where a sterile work environment is important. Other environments, such a laboratories developing microelectronic circuits and other equipment, also benefit from the ability of workers to activate equipment without having their hands come in contact with switches which may have very small particles of dirt or debris which may be potentially very damaging to fragile components used in such devices.

Due to the use of a single emitter 136 detector 142 pair, the small size of touchless switch 100 increases its value for other applications. In particular, alarm systems often benefit from the ability to place detection devices in relatively small locations. The size also is useful for other small locations, such as its use in door and automobile locks, discussed more fully below.

Since touchless switch 100 requires no moving parts, another use is in underwater applications. Touchless switch 100 can be encapsulated and used underwater to control devices such as lamps, etc. An example of use in this manner would be for entertainment uses, such as those found at water parks, public aquariums which present entertainment productions, industrial uses such as off shore drilling, etc.

A list of component values used in the preferred embodiment follows:

| | |
|---|---|
| Diode 108: | 1N4002 |
| Diode 126: | RLS4148 |
| Diode 136: | GIL-E22 |
| Zener Diode 114: | 1N5231B |
| Processor 140: | PIC16C71 |
| Transistor 120: | 2N2222S |
| Transistor 132: | 2N2222S |
| Capacitor 110: | 47 mf, 50V |
| Capacitor 118: | .1 mf |
| Capacitor 146: | 100 pf |
| Resistor 128: | 4700 ohms |
| I/R Detector 142: | GIL-D20 |
| Resistor 130: | 2 Meg ohms |
| Resistor 138: | 1500 ohms |
| Resistor 148: | 4700 ohms |
| Resistor 144: | 33 K ohms |
| Resistor 116: | 1800 ohms for a 12 VAC system |
| | 3300 ohms for an 18 VAC system |
| | 4700 ohms for a 24 VAC system |
| Resistor 122: | 0 ohms for a 12 VAC system |
| | 185 ohms for an 18 VAC system |
| | 0 ohms for a 24 VAC system |
| Resistor 134: | 100 ohms for a 12 VAC system |
| | 150 ohms for an 18 VAC system |
| | 200 ohms for a 24 VAC system |
| Relay 124: | 276AXXH-12D for a 12 VAC system |
| | 276AXXH-12D for an 18 VAC system |
| | 276AXXH-24D for a 24 VAC system |

Figure 2A:
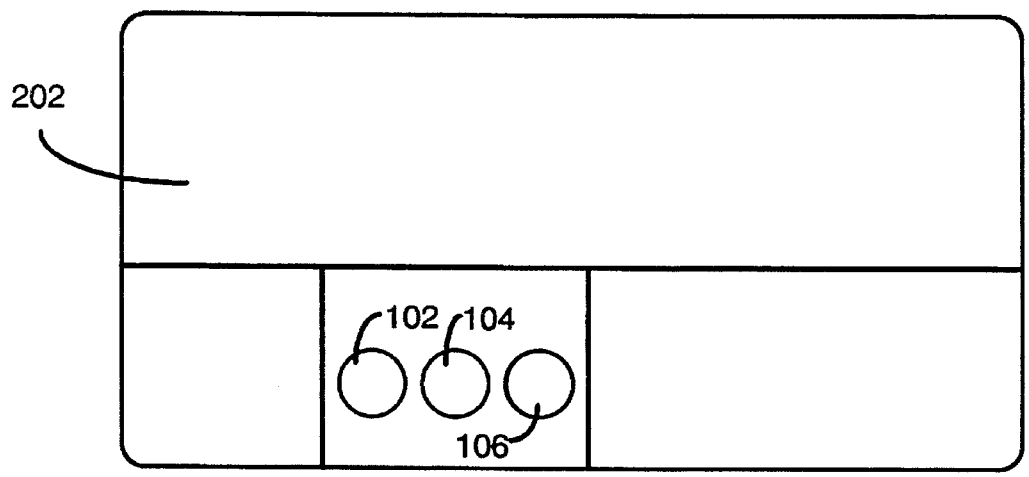
FIG. 2A is a preferred embodiment showing a rear view of the housing assembly and wiring connections.

FIG. 2A illustrates a rear view of the housing 202 used to hold touchless switch 100 in the preferred embodiment. Power lines 102, 104, 106 are shown entering housing 202.

Figure 2B:
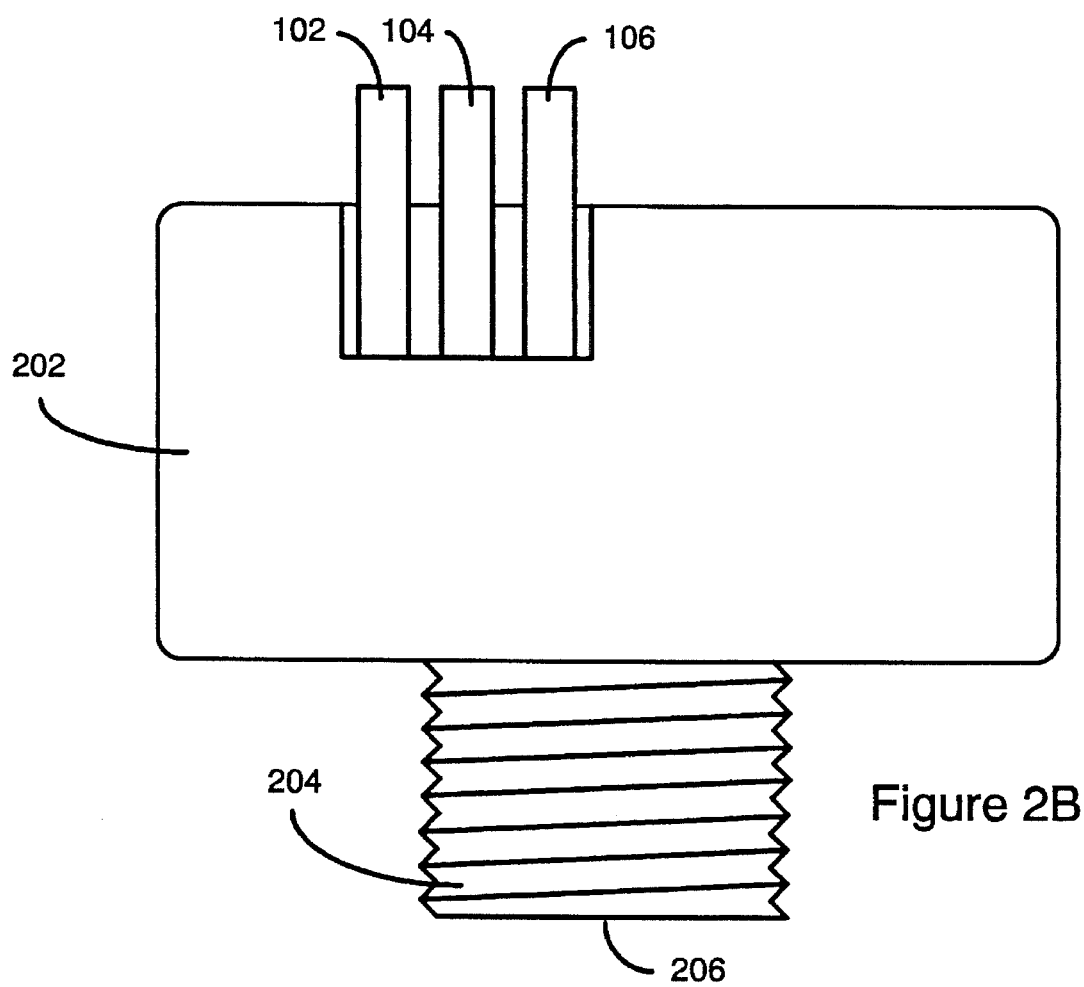
FIG. 2B is a side view of the embodiment of FIG. 2a showing the threaded extension of the housing assembly and wiring connections.

FIG. 2B illustrates a side view of the housing 202 used to hold touchless switch 100. Power lines 102, 104, 106 are shown entering housing 202. A threaded extension 204 of housing 202 is shown. Window 206 (not visible from this view) is at the end of threaded extension 204.

Figure 2C:
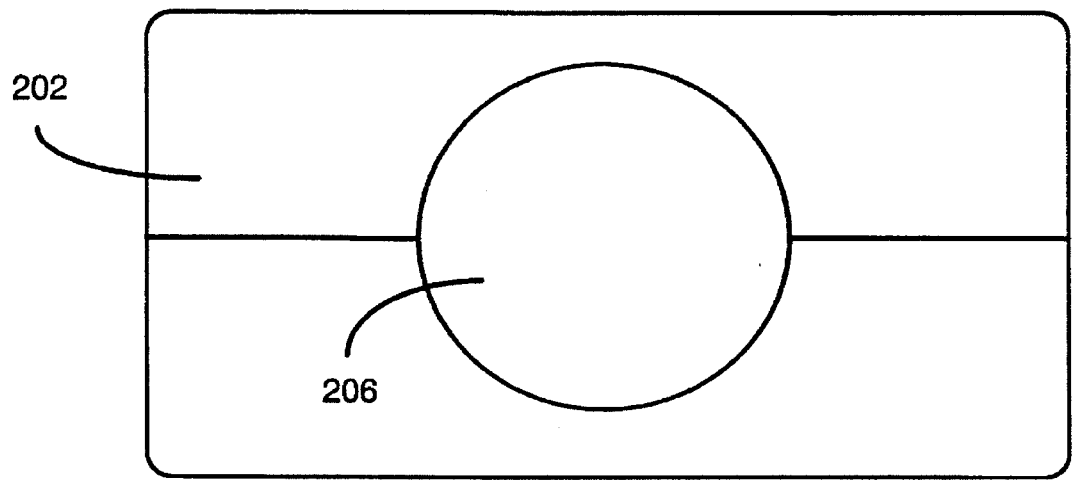
FIG. 2C is a front view of the embodiment of FIG. 2a showing the housing assembly, and the window at the end of the threaded extension of the housing assembly.

FIG. 2C illustrates a front view of the housing 202 used to hold touchless switch 100. Window 206 is at the end of threaded extension 204. Emitter 136 and detector 142 are located behind window 206 which is transparent to transmitted, reflected, and ambient energy.

Figure 2D:
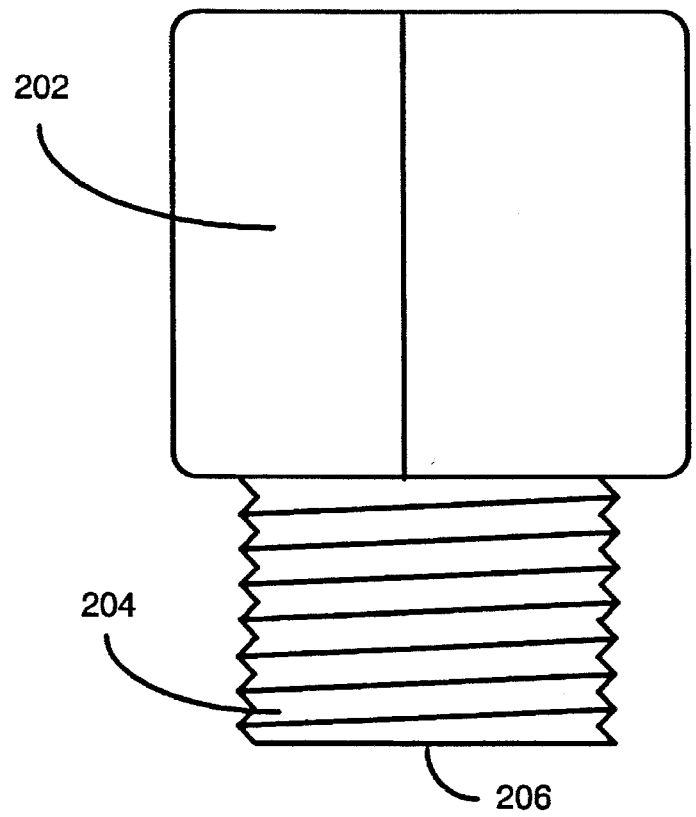
FIG. 2D is an end view of the embodiment of FIG. 2a showing the threaded extension of the housing assembly.

FIG. 2D illustrates an end view of the housing 202 used to hold touchless switch 100. Power lines 102, 104, 106 are not shown for ease of illustration. A threaded extension 204 of housing 202 is shown. Window 206 (not visible from this view) is at the end of threaded extension 204.

To extend the range of uses of the device, housing 202 can be constructed from waterproof materials and sealed such that the switch can be used in wet environments such as in conjunction with faucets (as discussed more fully below in regard to FIG. 10), but can also be used underwater. As a result, a variety of devices which would not heretofore be practical to use, such as cameras, industrial equipment, entertainment equipment, etc., can be more easily and safely operated or controlled by completely encapsulating those devices.

Figure 3:
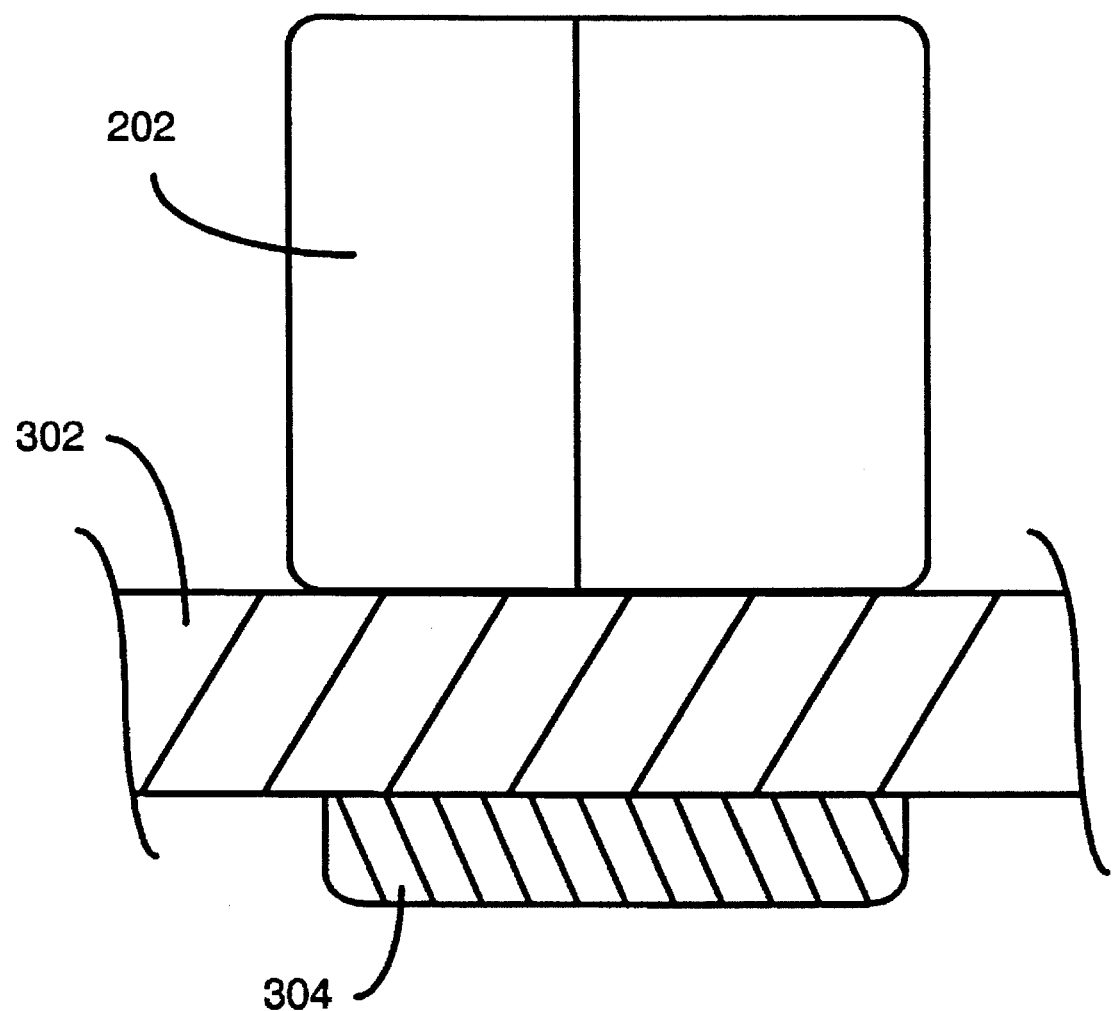
FIG. 3 is an end view of the embodiment of FIG. 2a showing the threaded extension of the housing assembly, a mounting bracket into which the threaded extension of the housing assembly is inserted and a locking nut.

In FIG. 3, touchless switch 100 is shown mounted in the wall 302 of a medical lamp. Threaded extension 204 (not shown) is inserted through an aperture in wall 302 and secured by nut 304. For aesthetic reasons, threaded extension 204 is preferably sized such that it is flush mounted to the edge of nut 304. Power lines 102, 104, 106 are not shown for ease of illustration. Of course, a variety of methods can be used to secure touchless switch 100. Therefore, the threaded extension 204 can be altered to suit a particular mounting technique.

Figure 4:
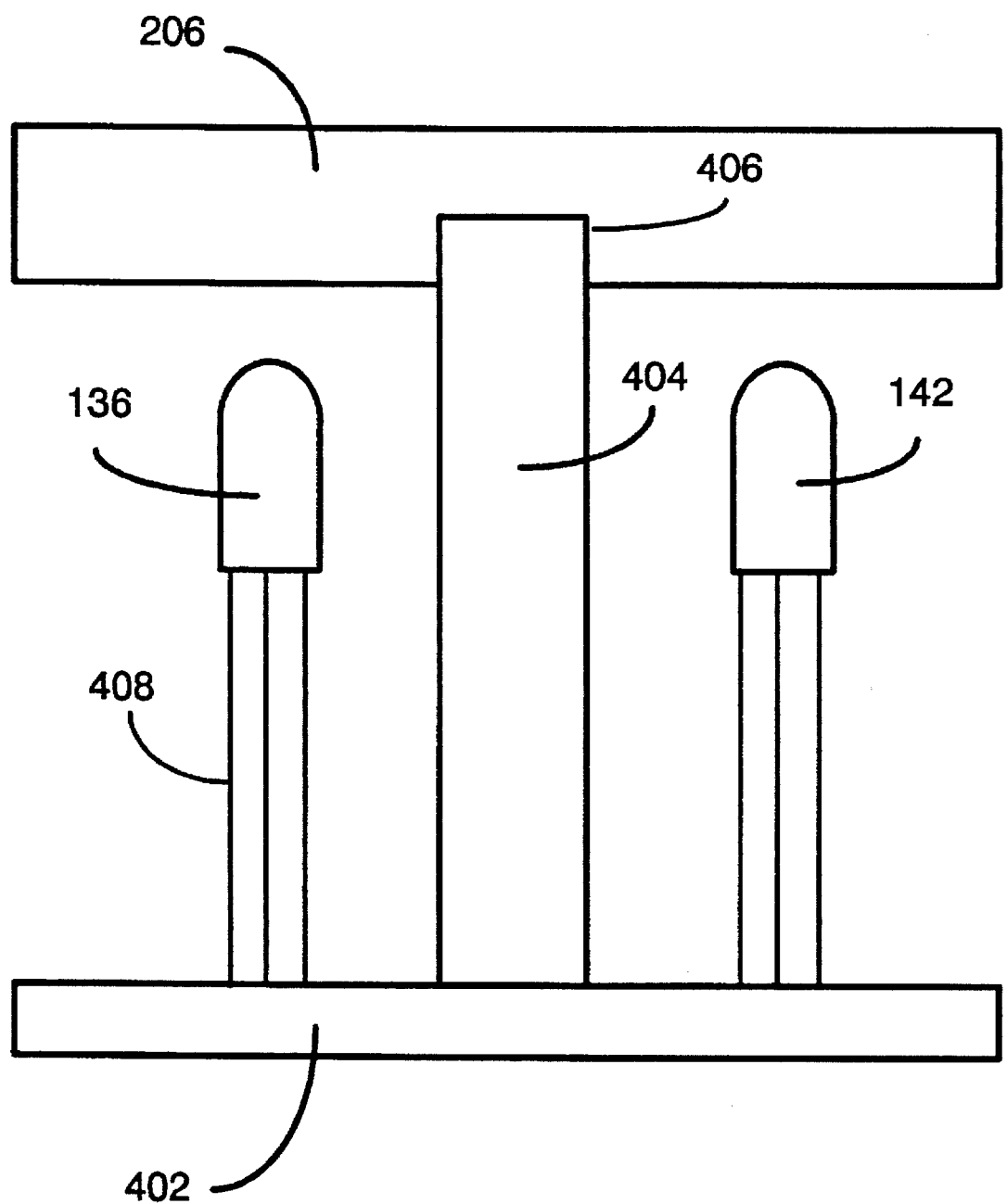
FIG. 4 is a side view showing the position of housing window and barrier wall in relation to the emitter and detector.

Regarding FIG. 4, a side view of window 206 is shown which includes barrier wall 404. Barrier wall 404 prevents light from being directly transmitted from emitter 136 to detector 142. By so doing, emitter 136 and detector 142 can be mounted in close proximity resulting in a more compact switch. Further the groove 406 in window 206 allows barrier wall 404 to be inserted below the inner surface of window 206. In turn, this prevents light transmitted from emitter 136 from being reflected off of the inner surface of window 206 to detector 142. Circuit board 402 is used to mount the components of touchless switch 100 illustrated in FIG. 1. Emitter 136 and detector 142 can be mounted close to circuit board 402, but in the preferred embodiment they are extended on wires 408 such that they are closer to window 206 thereby enabling better radiation of energy by emitter 136 and detection of energy by detector 142.

For ease of illustration, barrier wall 404 is shown as a flat solid wall. However, those skilled in the art will recognize that the wall can take any shape and be constructed from any suitable flexible or solid material. For example, even lightweight foil material can be used to accomplish the goals of the barrier wall. However, while most of the functions of the barrier wall 404 can be accomplished with a variety of materials and shapes, there is an advantage to the configuration shown in FIG. 4 in that by imbedding the barrier wall 404 into the surface of window 206, radiant energy from the emitter 136 is prevented from inadvertently reflecting off of the inner surface of window 206 and triggering false object detections.

Figure 5A:
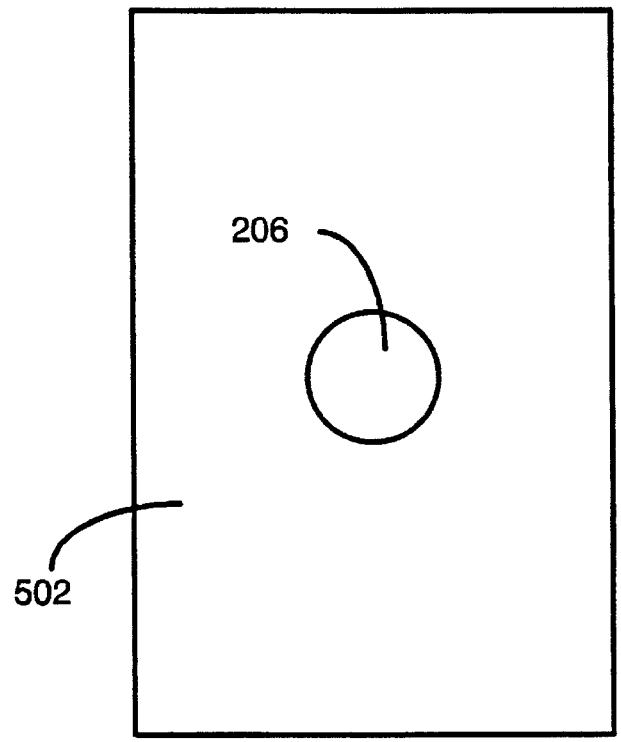
FIGS. 5A and 5B are an alternate embodiment illustrating use of the invention in a touchless wall switch.
Figure 5B:
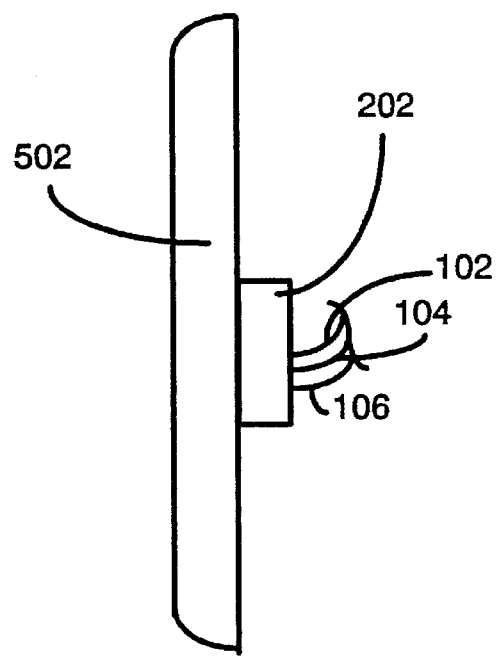

FIG. 5 shows an alternative embodiment in which touchless switch 100 is used in conjunction with a common wall switch plate for use in homes, offices, etc. Wall plate 502 is used to hold touchless switch 100 which is used to control common devices such as lights, fans, etc. An advantage of this embodiment is that wall switches do not become dirty from use, and the user does not pick up any contamination on the surface of the switch (which may be a problem in locations such as hospitals, etc.).

A variety of mounting techniques can be used including the thread and nut approach discussed above, adhesive, snap on connectors, etc. Of course, those skilled in the art will recognize that use of the invention in wall switches must take into account both physical size and intended current capacity. For example, the type of device activated by the switch and the required current can vary widely. While the embodiment illustrates in FIG. 1 may be adequate for low current devices such as lights, it may not be suitable for high current devices such as those using motors. In high current situations, the circuit may be modified to accommodate high current devices by replacing the relays with triacs, etc.

Figure 6:
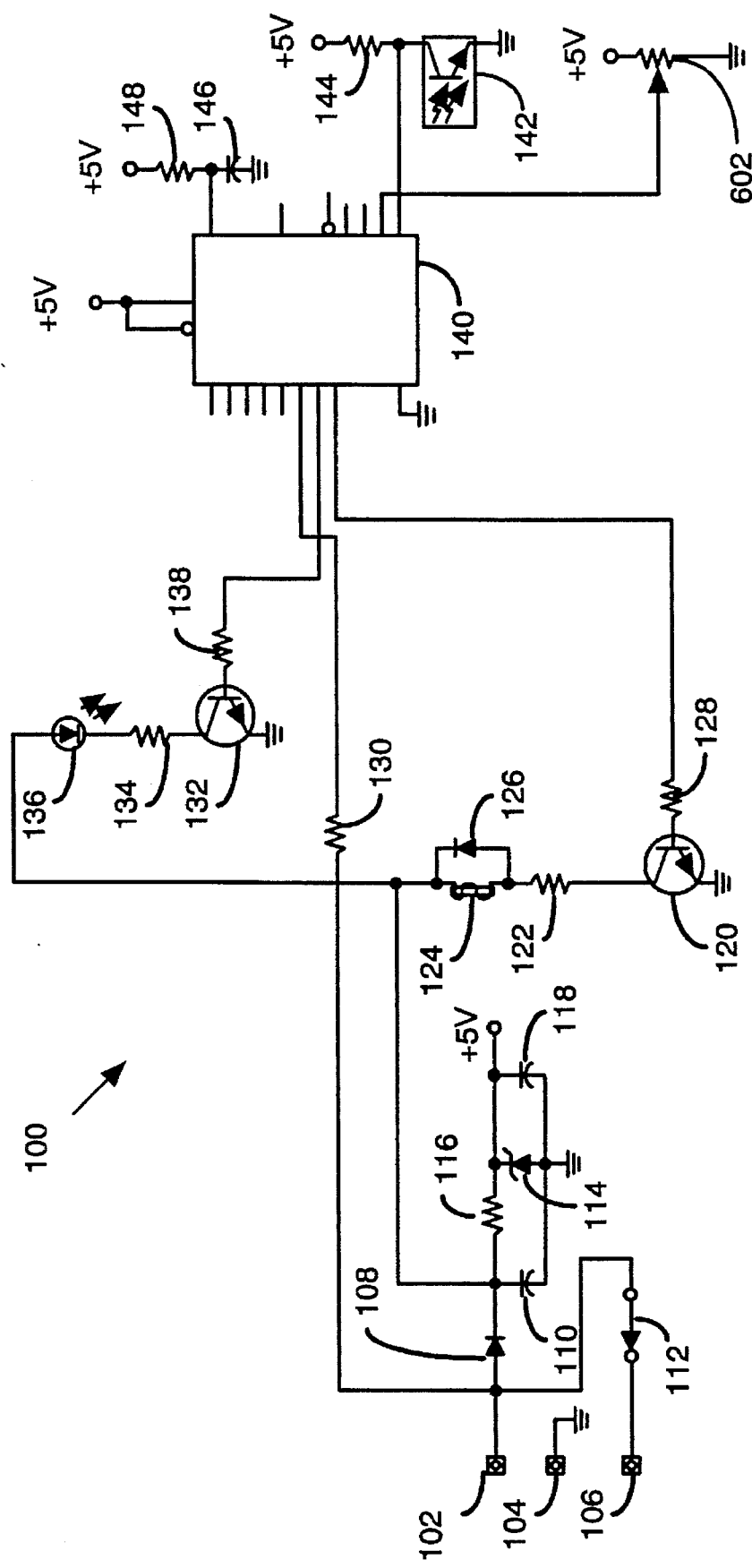
FIG. 6 is a detailed circuit diagram of an alternative embodiment of the invention of FIG. 1 with the addition of a sensitivity gain control.

FIG. 6 illustrates an alternative embodiment of the circuit discussed in FIG. 1. This embodiment allows the user to control the sensitivity of switch 100 by varying potentiometer 602 which is attached to pin 11 on processor 140 (not labeled). The value of potentiometer 602 is 50 K ohms in the preferred embodiment but can vary. The use of potentiometer 602 allows detectable distance of an object to vary from zero to a nominal five inches. In addition to allowing the switching distance to vary, the setting of potentiometer 602 can also be used to adjust the timeout value used for automatic shutoff, and to adjust hysteresis for the purpose of preventing false switches due to dust in the air, etc.

Figure 7A:
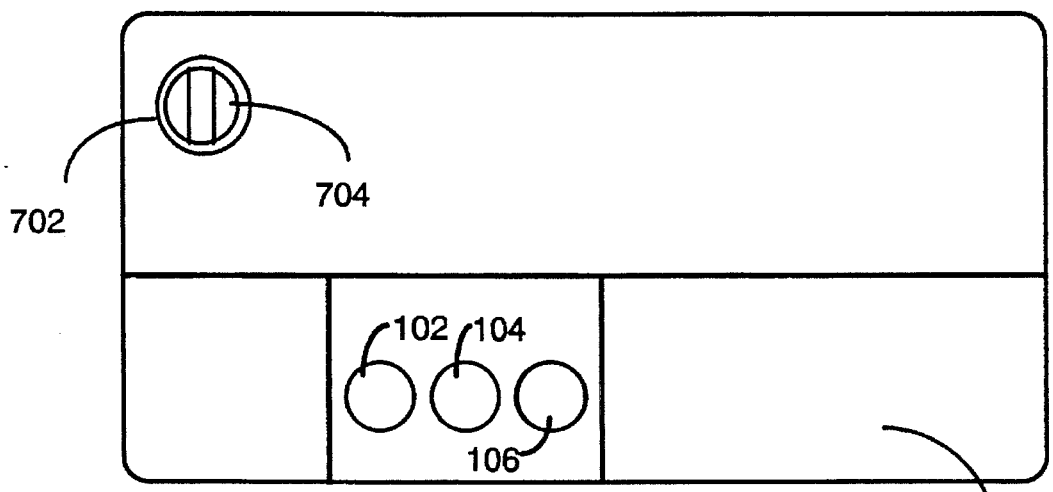
FIGS. 7A and 7B illustrate a mechanical adjustment used by the sensitivity gain control of FIG. 6.
Figure 7B:
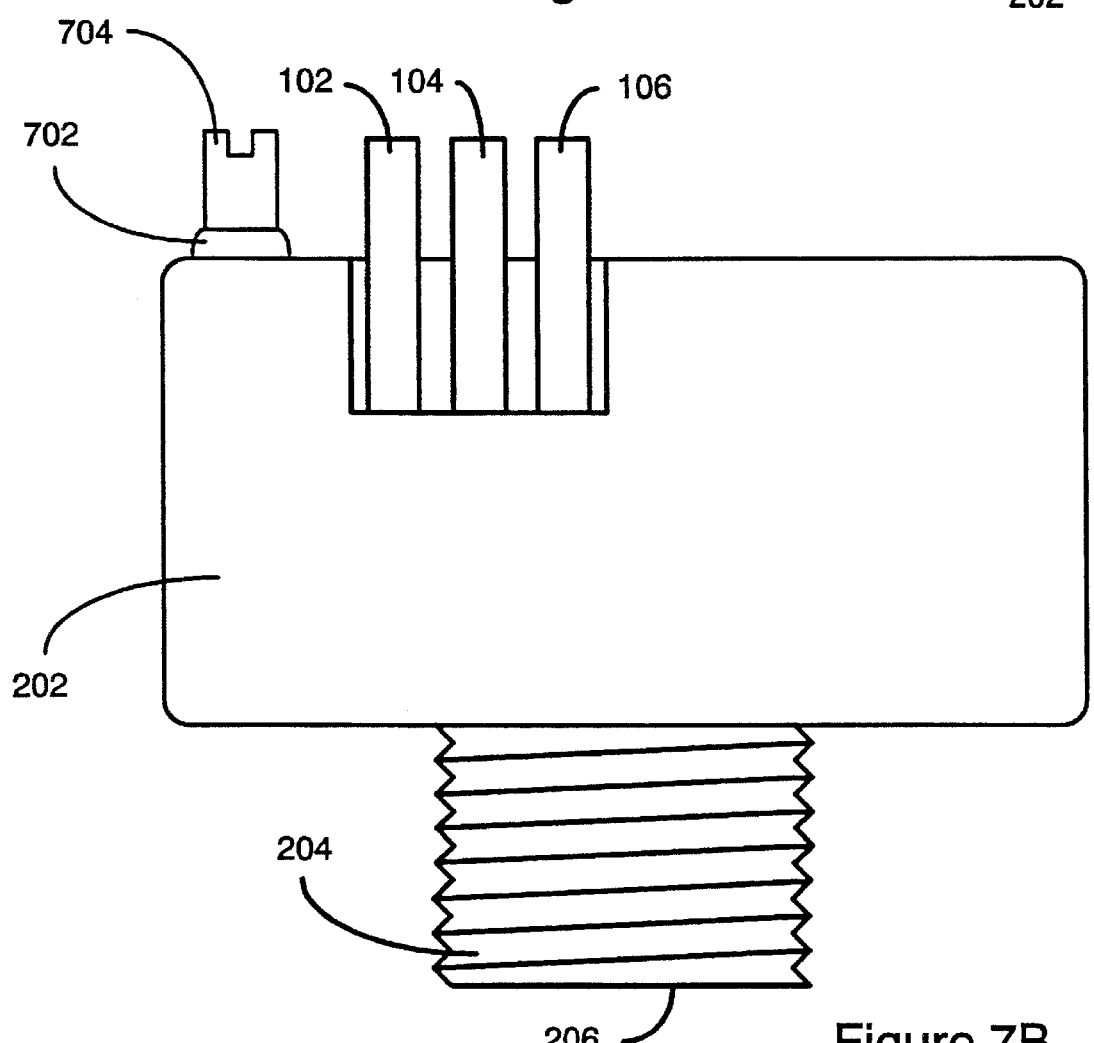

FIGS. 7A and 7B illustrate the physical placement of potentiometer 602. Adjustable knob 704 is attached to potentiometer 602 and allows the user to adjust sensitivity to suit a particular application. Nut 702 holds potentiometer 602 in place against housing 202. Of course, the physical placement of potentiometer 602 and shape of adjustment knob 704 can vary to suit any design requirement. For example, it can be placed on the front side of housing 202 such that it available to a user during everyday use or placed of the rear side of housing 202 as shown. Likewise, adjustable knob 704 can be replaced with an Allen screw, etc.

Figure 8:
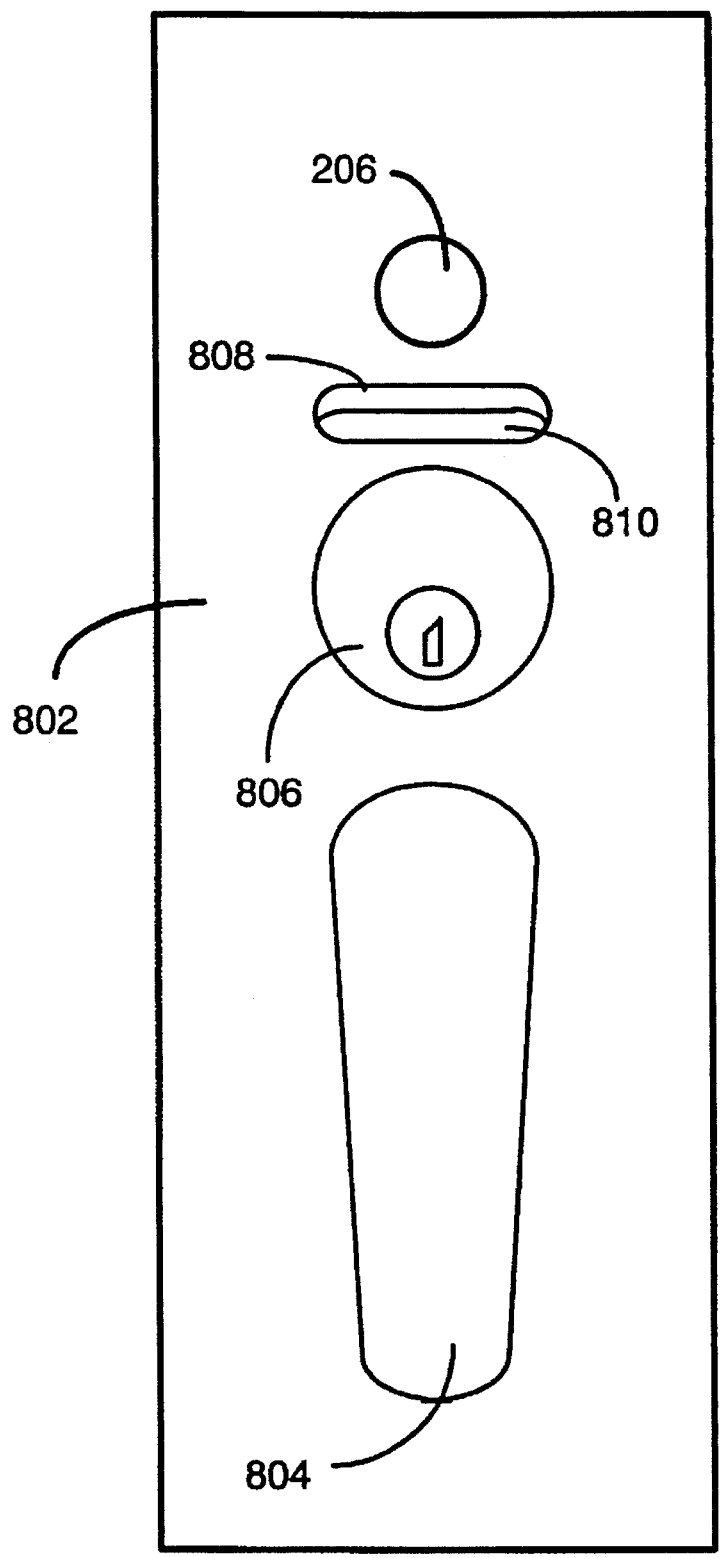
FIG. 8 illustrates an alternative embodiment of in which the touchless switch is used to illuminate a key actuated lock at night.

FIG. 8 illustrates another embodiment of the invention in which switch 100 is used to provide automatic illumination of locks at night. Conventional door lock bracket 802 shows handle 804 and lock 806. Switch 100 is mounted above lock 806 such that when the user's hand approaches lock 806 in the dark of night, the user's hand is detected by processor 140. As soon as the user's hand is detected, lamp 810 (shown with optional cover 808) is illuminated to allow the user to more easily unlock the door. Although this embodiment was illustrated as being applied to a conventional door lock, those skilled in the art will recognize that any lock which is apt to be used in the dark can benefit from the advantages of the invention. For example, vehicles, such as automobiles and boats, could also implement and benefit from the use of an automatically self illuminating lock made possible by switch 100. Further, the lock can be a conventional key lock or other locks such as combination locks or locks operated with keypads. An additional use is provided by the ability to encapsulate the switch such that it can be used underwater, thereby providing the ability to control underwater devices without having a remotely located switch.

Figure 9:
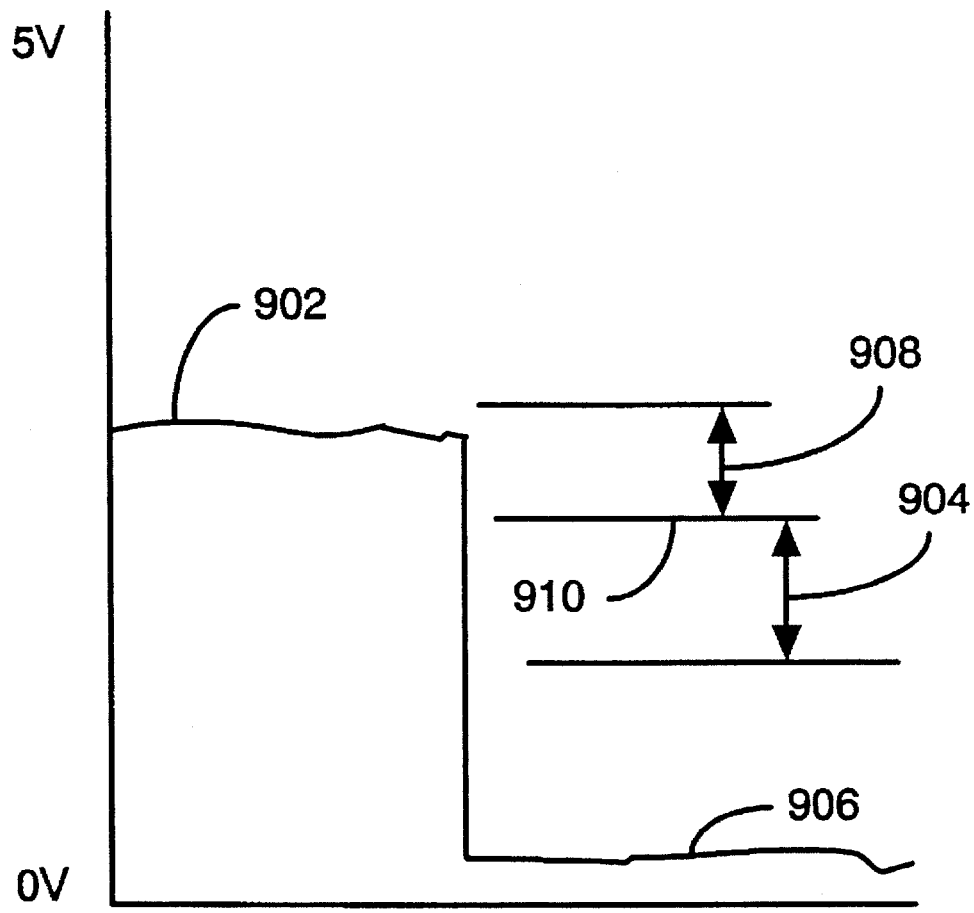
FIG. 9 illustrates the relative values of ambient energy, reflected energy and ambient saturation as found in the preferred embodiment.

FIG. 9 is a diagram showing relative detected energy levels during varying conditions, such as normal operation ambient energy, saturation energy levels, and energy levels when an object is present. Level 902 represents the normal level and fluctuation of ambient energy in a non-saturation environment. Hysteresis range 908 illustrates the normal variance in detected energy levels in conditions of normal ambient energy detection, known as hysteresis. Several factors can contribute to the sensitivity of switch 100 due to hysteresis. For example, if dust levels or smoke are present the energy they reflect when emitter 136 is on may cause detector 142 to produce an output which exceeds range 908. When range 908 is exceeded, the energy levels fall into range 904, the range where reflected energy in a toggle operation is detected, and a false toggle operation may be initiated. The output of potentiometer 602 can be used to control the size of range 908. By lowering level 910, the hysteresis effect is reduced and false toggles are reduced or eliminated.

Range 904 indicates a typical level of reflected energy when emitter 136 is activated and an object is reflecting energy to detector 142 to initiate a toggle operation. In normal operation, when emitter 136 is deactivated ambient energy is measured in range 908. Then, when emitter 136 is activated, energy reflected from the object is detected in range 904. Processor 140 then initiates a toggle operation.

During the ambient measurement stage, when emitter 136 is deactivated, detected energy levels exceeding those in range 904, as illustrated by level 906 are considered saturation levels. In saturation, processor 140 measures ambient energy when emitter 136 is deactivated. Since reflected energy would not be as high as level 906, processor 140 determines that a state of ambient energy saturation is present and does not activate emitter 136. When an object is placed in front of detector 142, then the blockage of ambient energy by the object will result in a measured reflected energy value lower than the saturated ambient value and a toggle operation will be initiated. When the object is removed, the rise in measured ambient energy during emitter 136 deactivation will be viewed as a return to the state of saturation and switch 100 will then wait for another toggle operation.

Those skilled in the art will recognize that potentiometer 602 can also be used to control the size of range 904 such that a user can adjust sensitivity to account for fluctuations in ambient energy as would be caused by changes in the position of the sun, etc. Further, potentiometer 602 could also be used to adjust the number of timing pulses required or the amount of time required before a timeout occurs.

Figure 10:
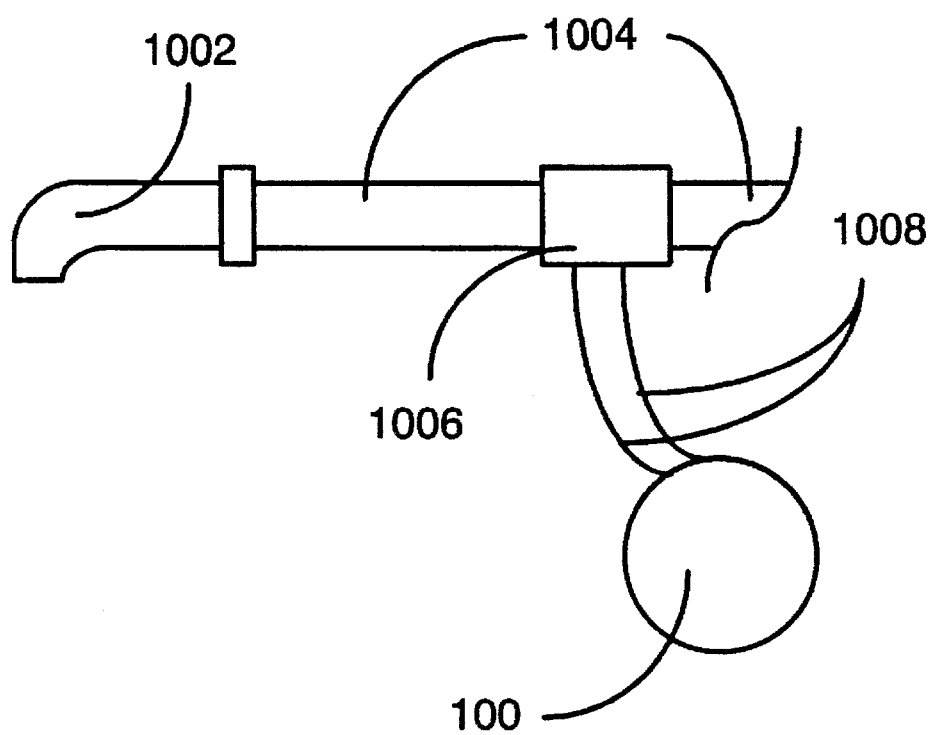
FIG. 10 illustrates an alternative embodiment in which the switch is used to control a faucet.

FIG. 10 illustrates another alternative embodiment of the invention in which touchless switch 100 is used to control a faucet 1002. Water is supplied to faucet 1002 via pipes 1004. Solenoid 1006 controls water flow to faucet 1002. Solenoid 1006 is in turn controlled by touchless switch 100 via wires 1008. Solenoids are well known in the art. This embodiment can also incorporate the timeout feature discussed above to reduce waste of water should the facet 1002 be inadvertently left on. There are several advantages provided by this embodiment. First, many of the mechanical components of the switch are eliminated. Second, unlike prior art devices, the faucet will not automatically turn on, but instead must be deliberately turned on by the user, thereby avoiding accidental activation.

Other applications include the use of the switch in conjunction with fluid tanks to allow the fluid levels within the tanks to be determined by using several touchless switches 100 in conjunction with a float (not shown). When a touchless switch 100 is activated by a float, an indicator (not shown) can be set to allow a user to determine the general status of a large fluid tank, such as a water tank, an underground gasoline tank or a vehicle used for transporting bulk fluids. In addition, opaque fluids can be directly detected without the use of floats.

As can be seen from the foregoing discussion, the invention provides several advantages, including automatic switching based on object detection, object motion, discrimination between toggle and non toggle motion, the ability to detect objects even when the ambient energy is saturating the detector 142, sensitivity control, inactivity time out controls, and the ability to control a variety of switching applications such as laboratory and medical lighting or switching devices, wall switches, water control mechanisms, alarm systems as well as automatics door, automobile, and boat lock illumination, etc.

While the invention has been described with respect to a preferred embodiment thereof, it will be understood by those skilled in the art that various changes in detail my be made therein without departing from the spirit, scope, and teaching of the invention. For example, the circuit can vary to accommodate a variety of power systems and processor types, the touchless switch 100 can be implemented in hardware or hardware and software, the switch can be applied to a variety of used use as medical and industrial devices as well as home and general business uses, individual components can be replaced without altering the function of the switch (such as using triacs instead of relays). Optional features such as inactivity timers and non-toggle motion discriminators, ambient energy saturation detection, and automatic lock illumination can also be incorporated. Accordingly, the invention herein disclosed is to be limited only as specified in the following claims.

We claim:

1. An object sensing toggle switch, comprising:

a housing assembly having an outer wall transparent to radiant energy;

a barrier;

the outer wall further having a groove in the inside surface and sized such that the edge of the barrier can fit within the groove;

an emitter;

a detector for determining the ambient energy level by detecting background energy when the emitter is not activated and for determining the reflected energy level when the emitter is activated;

the barrier positioned between the emitter and the detector such that energy is substantially prevented from being directly transmitted from the emitter to the detector;

the groove having a sufficient depth and the edge of the barrier located a sufficient depth within the groove such that energy transmitted from the emitter is substantially prevented from being reflected by the outer wall back to the detector;

a processor, the processor further comprising:
   an input to accept the output of the detector;
   means to determine a value representative of the ambient energy level;
   means to determine a value representative of the reflected energy level when the emitter is activated;
   comparison means to generate a difference value representing the difference between the value representing the ambient energy level and the reflected energy level;
   means to selectably activate the emitter and to selectably monitor the detector; and
   means to toggle the switch when the difference value exceeds a predetermined amount.

2. A switch, as in claim 1, wherein:

the ambient energy is measured for a preselected period of time prior to activation of the emitter;

the emitter is activated for a preselected number of time periods during measurement of energy levels; and the switch is toggled when objects are detected for a predetermined number of consecutive time periods.

3. A switch, as in claim 2, further comprising means to adjust the sensitivity of the switch such that the distance that the detector can detect an object represented by the predetermined amount of difference value required to toggle the switch is adjustable.

4. A switch, as in claim 2, further comprising hysteresis adjustment means to adjust the hysteresis range such that the minimum predetermined amount of difference value required to toggle the switch is adjustable.

5. A switch, as in claim 2, further comprising timing adjustment means to adjust the minimum number of cycles in which the predetermined amount of difference value is detected before the switch is toggled.

6. A switch, as in claim 2, further comprising timeout means to automatically restore the switch to the off position after a predetermined period of inactivity.

7. A switch, as in claim 2, wherein the processor:

determines when the detector is saturated by ambient energy by measuring the output of the detector when the emitter is deactivated;

measures reflected energy when the emitter is activated; and initiates a switch toggle when the measured reflected energy is lower than the saturated ambient energy.

8. A switch, as in claim 7, further comprising means to adjust the sensitivity of the switch such that the distance that the detector can detect an object represented by the predetermined amount of difference value required to toggle the switch is adjustable.

9. A switch, as in claim 7, further comprising hysteresis adjustment means to adjust the hysteresis range such that the minimum predetermined amount of difference value required to toggle the switch is adjustable.

10. A switch, as in claim 7, further comprising timing adjustment means to adjust the minimum number of cycles in which the predetermined amount of difference value is detected before the switch is toggled.

11. A switch, as in claim 7, further comprising timeout means to automatically restore the switch to the off position after a predetermined period of inactivity.

12. A switch, as in claim 2, further comprising:

a wall plate; and means to attach the housing to the wall plate such that the switch can be activated by an object passing in front of the wall plate.

13. A switch, as in claim 2, further comprising:

a lock;

a lamp positioned such that the lock is illuminated when the lamp is lit; and means to activate the lamp when the detector senses an object.

14. A switch, as in claim 2, further comprising:

encapsulation means to form a barrier such that the switch is submersible in water.

15. A switch, as in claim 2, further comprising:

a faucet;

solenoid means to control water flow to the faucet; and means to activate the solenoid when the switch initiates a toggle operation.

* * * * *